(12) United States Patent
Neidorff

(10) Patent No.: US 11,521,695 B1
(45) Date of Patent: Dec. 6, 2022

(54) DIGITAL BIT GENERATORS FOR TRIM CIRCUITS

(71) Applicant: TEXAS INSTRUMENTS INCORPORATED, Dallas, TX (US)

(72) Inventor: Robert Allan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/347,236

(22) Filed: Jun. 14, 2021

(51) Int. Cl.
  *G11C 29/02* (2006.01)
  *G11C 5/14* (2006.01)

(52) U.S. Cl.
  CPC .......... *G11C 29/028* (2013.01); *G11C 5/147* (2013.01); *G11C 29/021* (2013.01)

(58) Field of Classification Search
  CPC ..... G11C 29/028; G11C 29/021; G11C 17/18; G11C 5/147
  See application file for complete search history.

(56) References Cited

U.S. PATENT DOCUMENTS

| 5,867,008 A | * | 2/1999 | Du | H02J 7/0031 320/136 |
| 8,710,902 B2 | | 4/2014 | Sakurai et al. | |
| 2007/0058473 A1 | * | 3/2007 | Kouchi | G11C 17/16 365/225.7 |

FOREIGN PATENT DOCUMENTS

| CN | 105185776 A | * | 12/2015 |
| CN | 205657881 U | * | 10/2016 |

* cited by examiner

*Primary Examiner* — Sultana Begum
(74) *Attorney, Agent, or Firm* — Michael A. Davis, Jr.; Frank D. Cimino

(57) ABSTRACT

In some examples, a circuit comprises a first polyfuse and a first diode having a first diode anode and a first diode cathode, where the first diode anode is coupled to the first polyfuse. The circuit comprises a second polyfuse coupled to the first polyfuse and a second diode having a second diode anode and a second diode cathode, where the second diode cathode is coupled to the second polyfuse. The circuit comprises a probe pad coupled to the first diode cathode and the second diode anode.

17 Claims, 4 Drawing Sheets

DIGITAL BIT GENERATORS FOR TRIM CIRCUITS

BACKGROUND

Although integrated circuit (IC) manufacturers may use the same equipment and the same designs to produce multiple ICS, the ICS may still differ from each other in subtle ways due to process variations. Manufacturers often use trim circuits during IC testing to fine-tune, or trim, the ICS, thereby mitigating the process variations.

SUMMARY

In some examples, a circuit comprises a first polyfuse and a first diode having a first diode anode and a first diode cathode, where the first diode anode is coupled to the first polyfuse. The circuit comprises a second polyfuse coupled to the first polyfuse and a second diode having a second diode anode and a second diode cathode, where the second diode cathode is coupled to the second polyfuse. The circuit comprises a probe pad coupled to the first diode cathode and the second diode anode.

DETAILED DESCRIPTION

Various trimming technologies are used in different contexts to mitigate process variations. Many modern trimming technologies entail the manipulation of switches to introduce or remove circuit components (e.g., resistors) from an IC. For example, each IC on a single semiconductor wafer may have a target resistance value of 20 kilo Ohms, but due to process variations, one of the ICS on the wafer may have a resistance value of 18 kilo Ohms. Trimming technology may be used to turn on a switch that introduces 2 kilo Ohms to the 18 kilo Ohms already provided in the circuit.

In some modern trimming technologies, switches may be turned on or off using digital bits. In these technologies, certain types of memory (e.g., non-volatile memory, including flash memory) are useful to store digital bits. However, such memory is expensive, and while premium IC products may justify the expense of using non-volatile memory in trimming circuits, many other IC products cannot justify this expense.

Polyfuses are useful in low-cost ICS in lieu of non-volatile memory. However, each polyfuse entails the use of a dedicated probe pad to manipulate the polyfuse. An IC including multiple polyfuses will also include multiple probe pads, one for each polyfuse, which results in a substantially increased die size.

This description provides various examples of digital bit generators for trim circuits in ICS. In some examples, the digital bit generator includes a first polyfuse, and a first diode having a first diode anode and a first diode cathode. The first diode anode is coupled to the first polyfuse. The digital bit generator includes a second polyfuse coupled to the first polyfuse, and a second diode having a second diode anode and a second diode cathode. The second diode cathode is coupled to the second polyfuse. The digital bit generator includes a ground terminal coupled to the first and second polyfuses and a probe pad coupled to the first diode cathode and the second diode anode. The digital bit generators described herein are low-cost relative to solutions using non-volatile memory. Furthermore, although the digital bit generators described herein include polyfuses, they do not include a separate probe pad for each polyfuse. Rather, the digital bit generators described herein include a single probe pad for each pair of polyfuses, thereby significantly reducing the number of probe pads and, consequently, die size. Thus, the digital bit generators described herein are space-efficient. Examples of the digital bit generators are now described with reference to the drawings.

Figure 1:
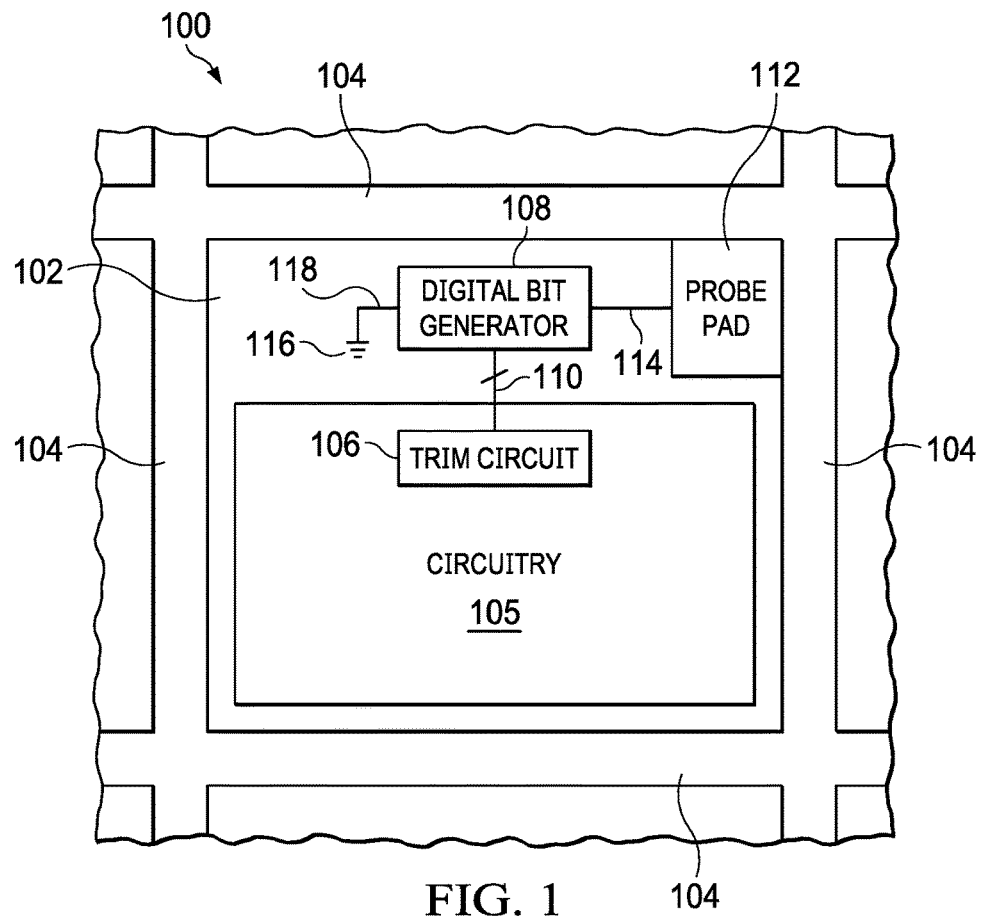
FIG. 1 is a schematic diagram of a semiconductor wafer including a die having a digital bit generator, in various examples.

FIG. 1 is a schematic diagram of a semiconductor wafer 100 in various examples. The semiconductor wafer 100 may include silicon or another suitable semiconductor material. The semiconductor wafer 100 includes a semiconductor die 102 separated from other semiconductor dies by scribe streets 104. The semiconductor die 102 includes circuitry 105, which includes circuitry that enables the semiconductor die 102 to perform the function(s) for which it was manufactured. The circuitry 105 also includes a trim circuit 106. The semiconductor die 102 includes a digital bit generator (DBG) 108 coupled to the trim circuit 106 by way of connections 110. The semiconductor die 102 includes a probe pad 112 coupled to the DBG 108 by way of a connection 114, and it also includes a ground terminal 116 coupled to the DBG 108 via a connection 118.

The semiconductor wafer 100 may be in a testing stage of manufacture, during which the semiconductor wafer 100 is positioned on a chuck and subjected to various tests using probes or other appropriate test equipment. Such tests may reveal that trimming the circuitry 105 would be useful to mitigate process variations in the circuitry 105. Accordingly, a probe is placed in contact with the probe pad 112. The probe applies a voltage to the probe pad 112, causing current to flow through the DBG 108. Responsive to this current flow, the DBG 108 opens a fuse (e.g., a polyfuse), which causes the DBG 108 to provide specific digital bit(s) to the trim circuit 106 via the connection(s) 110. Responsive to the receipt of such digital bit(s), the trim circuit 106 opens and/or closes one or more switches in the trim circuit 106 to introduce or remove circuit components (e.g., resistors, capacitors, transistors) from the circuitry 105.

Figure 2:
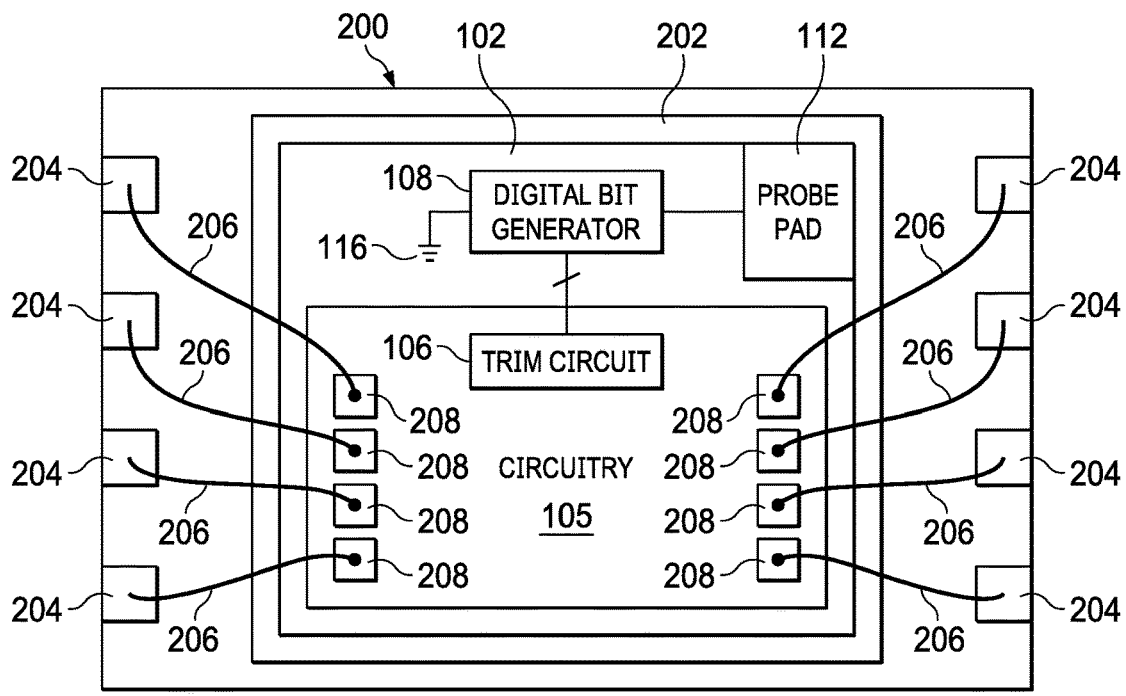
FIG. 2 is a schematic diagram of a semiconductor package including a die having a digital bit generator, in various examples.

FIG. 2 is a schematic diagram of a semiconductor package 200 in various examples. The semiconductor package 200 includes the semiconductor die 102 described above with reference to FIG. 1. In examples, the semiconductor die 102 is coupled to a die pad 202 using a die attach layer. The semiconductor package 200 includes multiple conductive terminals 204. Bond wires 206 are coupled to the conductive terminals 204 and to bond pads 208. Copper pillars or other connectors also may be useful for forming the connections established by bond wires 206. Bond pads 208 are coupled to circuitry 105. In examples, the semiconductor package 200 is a quad flat no lead (QFN) package, as FIG. 2 shows. The scope of description also includes other types of packages, such as dual inline packages (DIP). In some examples, one or more of the fuses (e.g., polyfuses) in the DBG 108 is open (or "blown").

Figure 3:
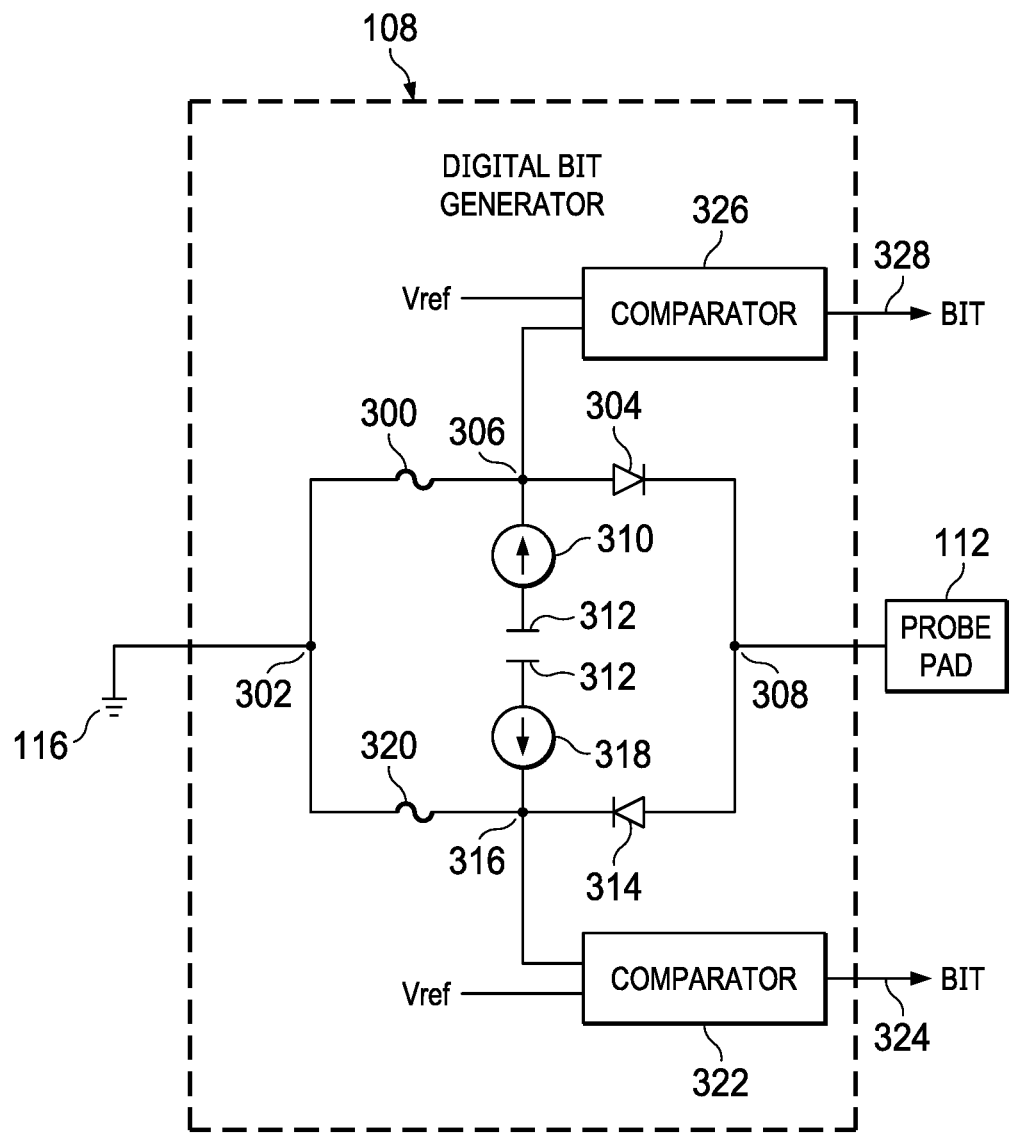
FIG. 3 is a circuit diagram of a digital bit generator in various examples.

FIG. 3 is a circuit diagram of the DBG 108 in various examples. In some examples, the DBG 108 includes a fuse 300 (e.g., a polyfuse). The fuse 300 includes a first terminal and a second terminal. The first terminal of the fuse 300 is coupled to ground terminal 116 at a node 302. The second terminal of the fuse 300 is coupled to an anode of a diode 304 at a node 306. A cathode of the diode 304 is coupled to the probe pad 112 at a node 308. In some examples, the diode 304 includes a diode-connected transistor, such as a diode-connected field effect transistor (e.g., a diode-connected metal oxide semiconductor FET, also called a diode-connected MOSFET). The DBG 108 includes a current source 310 (e.g., a transistor or a resistor) that is coupled to a voltage source 312. The DBG 108 includes a diode 314. An anode of the diode 314 is coupled to the node 308. A cathode of the diode 314 is coupled to a node 316. In some examples, the diode 314 includes a diode-connected transistor, such as a diode-connected field effect transistor (e.g., a diode-connected MOSFET). A current source 318 (e.g., a transistor or a resistor) is coupled to the node 316 and to the voltage source 312. The DBG 108 includes a fuse 320 (e.g., a polyfuse) having first and second terminals. The first terminal of the fuse 320 is coupled to the node 302. The second terminal of the fuse 320 is coupled to the node 316.

The DBG 108 may include a comparator 322 having first and second input terminals and an output terminal 324. The first input terminal of the comparator 322 is coupled to the node 316. The second input terminal of the comparator 322 is coupled to a reference voltage source. The output terminal 324 of the comparator 322 is configured to provide a digital bit, as described below.

In examples, the DBG 108 also includes a comparator 326 having first and second input terminals and an output terminal 328. The first input terminal of the comparator 326 is coupled to the node 306. The second input terminal of the comparator 326 is coupled to a reference voltage source, which may or may not be the same reference voltage source as that coupled to the second input terminal of the comparator 322. The output terminal 328 of the comparator 326 is configured to provide a digital bit responsive to the state of the fuse 300, as described below.

FIG. 3 shows the comparators 322 and 326 as blocks because the scope of this description is not limited to any specific comparator architecture. Example circuit diagrams of comparators 322 and 326 are provided in FIGS. 4 and 5 and are described below, but other types of comparators are also contemplated and included in the scope of this description. Any circuit or component that is configured to provide a digital bit responsive to an analog input may be useful as a comparator 322 or 326.

In operation, a probe (e.g., a probe of an automated testing machine) may apply a voltage to the probe pad 112, causing the DBG 108 to provide a digital bit(s) to the trim circuit 106 (FIGS. 1 and 2). In some examples, the voltage applied to the probe pad 112 is positive relative to ground terminal 116. In such examples, the voltage applied may be sufficiently high to forward-bias the diode 314. Accordingly, the diode 314 turns on, and current flows through the diode 314 and the fuse 320 toward ground terminal 116. In examples, the voltage applied across the probe pad 112 is sufficiently high to blow or open the fuse 320, meaning that the fuse 320 has a sufficiently high resistance to prevent current flow through the fuse 320. The voltage applied to the probe pad 112 is applied briefly and then removed, resulting in a blown fuse 320 and the diode 314 turning off. Accordingly, the node 316 is electrically isolated from the nodes 308 and 302. The current source 318 pulls up the voltage at node 316 sufficiently high to exceed the reference voltage provided to the comparator 322. Consequently, the comparator 322 provides a digital bit 1 (or "high") on output terminal 324. The diode 304 is reverse-biased, so the diode 304 remains off and the fuse 300 remains closed (e.g., able to conduct current). The current source 310 provides a current to node 306, but this current is inconsequential to the digital outputs of the DBG 108 in this example, because the current flows to ground terminal 116 via the node 302. Thus, the comparator 326 provides a digital bit 0 (or "low") on output terminal 328. Thus, by applying a sufficiently high voltage to the probe pad 112, the DBG 108 provides a digital bit string of 10 on output terminals 324, 328, respectively. However, as described below with reference to FIGS. 4 and 5, in some examples the comparator 322 may provide a digital bit 0 on output terminal 324 responsive to the node 316 being high, and the comparator 326 may provide a digital bit 1 on output terminal 328 responsive to the node 306 being low.

In other examples of operation, a negative voltage may be applied to the probe pad 112 relative to the ground terminal 116. Accordingly, diode 314 is reverse-biased and remains off. Diode 304, however, is forward-biased and turns on. The voltage differential between the probe pad 112 and the ground terminal 116 may be sufficiently large that the current flowing through the fuse 300 and diode 304 blows the fuse 300, causing the fuse 300 to open, or stop conducting current. The voltage applied to the probe pad 112 is removed, causing the diode 304 to turn off. The node 306 is thus electrically isolated from the nodes 302 and 308. The current source 310 provides a current that pulls up the voltage at node 306. As the voltage at node 306 rises, it may forward-bias the diodes 304 and 314, and the diodes 304 and 314 may begin conducting current. Accordingly, in some examples, the reference voltage provided to the comparator 326 is lower than the sum of the threshold voltages of the diodes 304 and 314. Accordingly, as the voltage at node 306 rises, it may first cause the comparator 326 to provide a digital bit 1 (or digital bit 0, depending on the comparator 326 architecture) on output terminal 328, and then the voltage at node 306 may cause the diodes 304 and 314 to turn on. Current flowing through the diodes 304 and 314, however, will not drop the voltage at node 306 sufficiently to cause the comparator 326 to provide a digital bit 0 (or "low") at output terminal 328. Thus, by applying a sufficiently low voltage (e.g., a negative voltage with a sufficiently large absolute value) to the probe pad 112, the DBG 108 provides a digital bit string of 01 on the output terminals 324, 328, respectively.

Applying no voltage on the probe pad 112 causes the fuses 300, 320 to remain closed (or conducting), and the diodes 304, 314 remain off. Thus, current produced by the current source 310 flows to the ground terminal 116, and current produced by the current source 318 also flows to the ground terminal 116. Consequently, the comparator 322 provides a digital bit 0 on the output terminal 324, and the comparator 326 provides a digital bit 0 on the output terminal 328.

A digital bit string of 11 may be produced by applying a sufficiently high voltage on the probe pad 112, followed by a sufficiently low voltage (e.g., a negative voltage with a sufficiently large absolute value) on the probe pad 112. Alternatively, a sufficiently low voltage may be applied to the probe pad 112, followed by a sufficiently high voltage on the probe pad 112. Either of these approaches will blow both of the fuses 300 and 320, and because diodes 304 and 314 will be off after the voltage(s) are no longer applied at the probe pad 112, the current sources 310 and 318 will pull up the voltages at nodes 306 and 316, respectively. Rising voltages at the nodes 306 and 316 may cause the comparators 322 and 326 to provide digital bits 1 and 1, respectively, at output terminals 324 and 328, respectively. In some examples, after testing, the probe on 112 is removed. The voltage on node 308 will settle at a level determined by the states of fuses 300 and 320, and the comparator 322, 326 outputs will remain in the states previously determined by the fuses 300 and 320.

As described, the voltages at nodes 306 and 316 may be pulled up or down, depending on the states of the fuses 300 and 320. However, the architectures of the comparators 322 and 326 may determine the digital bits provided on the output terminals 324 and 328. For example, a high voltage at node 306 may cause the comparator 326 to provide a digital bit 0 or 1 on the output terminal 328, depending on the architecture of the comparator 326. Similarly, a low voltage at node 306 may cause the comparator 326 to provide a digital bit 0 or 1 on the output terminal 328, depending on the architecture of the comparator 326. Similarly, a high voltage at node 316 may cause the comparator 322 to provide a digital bit 0 or 1 on the output terminal 324, depending on the architecture of the comparator 322. Similarly, a low voltage at node 316 may cause the comparator 322 to provide a digital bit 0 or 1 on the output terminal 324, depending on the architecture of the comparator 322.

Figure 4:
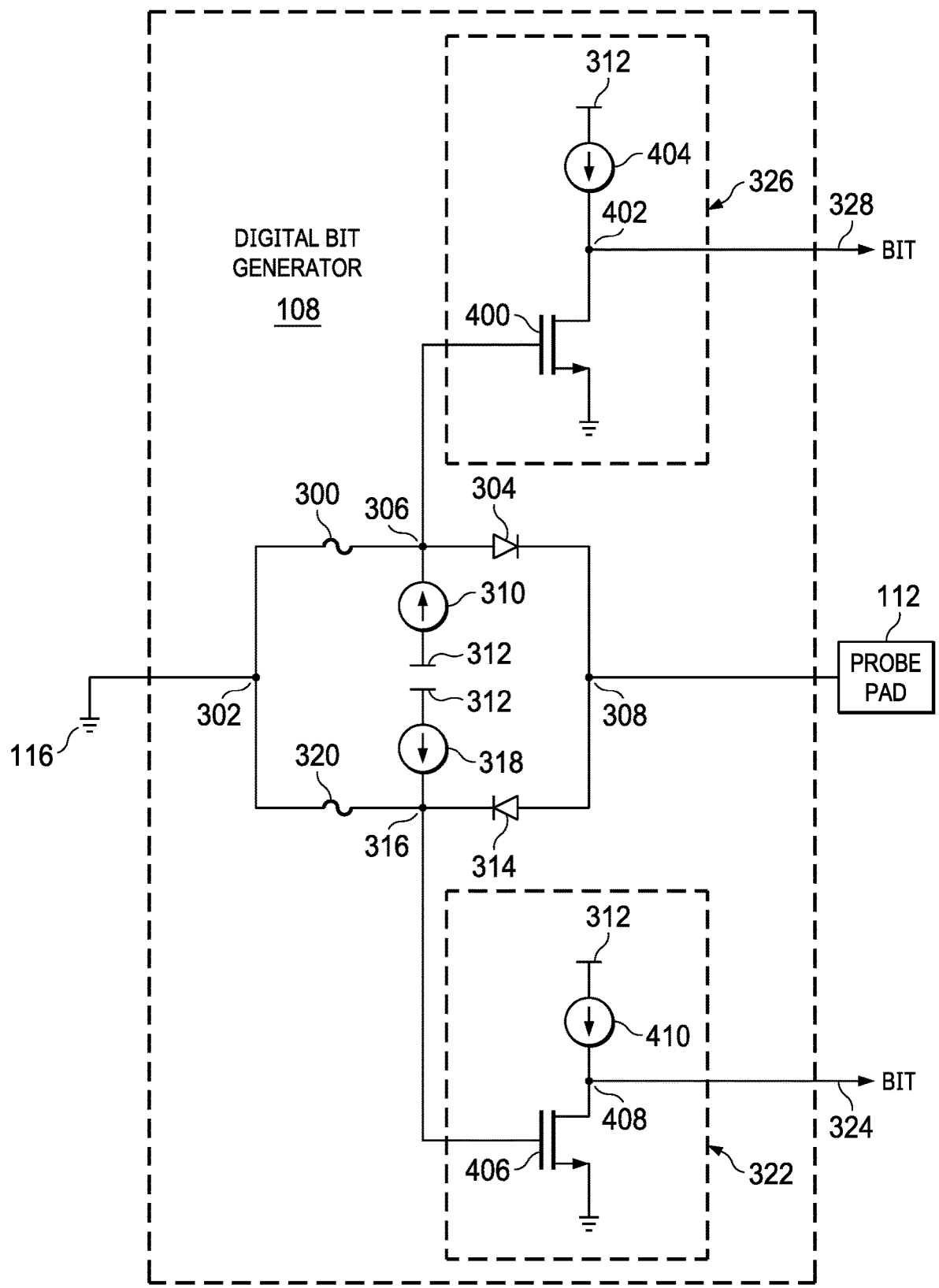
FIG. 4 is a circuit diagram of a digital bit generator in various examples.

FIG. 4 is a circuit diagram of the DBG 108 in various examples. The example DBG 108 in FIG. 4 is identical to that shown in FIG. 3, but the example in FIG. 4 includes example circuits for the comparators 322 and 326. The example comparator 326 in FIG. 4 includes a transistor 400, such as an n-type field effect transistor (FET). The source of the transistor 400 is coupled to ground, the gate of the transistor 400 is coupled to the node 306, and the drain of the transistor 400 is coupled to a node 402. The node 402 is coupled to a current source 404, and the current source 404 is coupled to the voltage source 312. The node 402 is also coupled to the output terminal 328.

The example comparator 322 in FIG. 4 includes a transistor 406, such as an n-type FET. The source of the transistor 406 is coupled to ground, the gate of the transistor 406 is coupled to the node 316, and the drain of the transistor 406 is coupled to a node 408. The node 408 is coupled to a current source 410, and the current source 410 is coupled to the voltage source 312. The node 408 is also coupled to the output terminal 324.

The operation of the DBG 108 in FIG. 4 is identical to that in FIG. 3, except as described below. In FIG. 4, the threshold voltage of the transistor 400 serves as the reference voltage input to the comparator 326 in FIG. 3. Similarly, in FIG. 4, the threshold voltage of the transistor 406 serves as the reference voltage input to the comparator 322 in FIG. 3. Responsive to receiving a high voltage at the gate of transistor 400, the transistor 400 turns on, pulling the output terminal 328 down to ground (e.g., a digital bit 0). Responsive to receiving a low voltage at the gate of the transistor 400, the transistor 400 turns off, pulling the output terminal 328 up to a digital bit 1. As described above, different comparator architectures, inverters, etc. are useful to produce a digital bit 0. Similarly, responsive to receiving a high voltage at the gate of transistor 406, the transistor 406 turns on, pulling the output terminal 324 down to ground (e.g., a digital bit 0). Responsive to receiving a low voltage at the gate of the transistor 406, the transistor 406 turns off, pulling the output terminal 324 up to a digital bit 1. As described above, different comparator architectures, inverters, etc. are useful to provide a digital bit 0.

Figure 5:
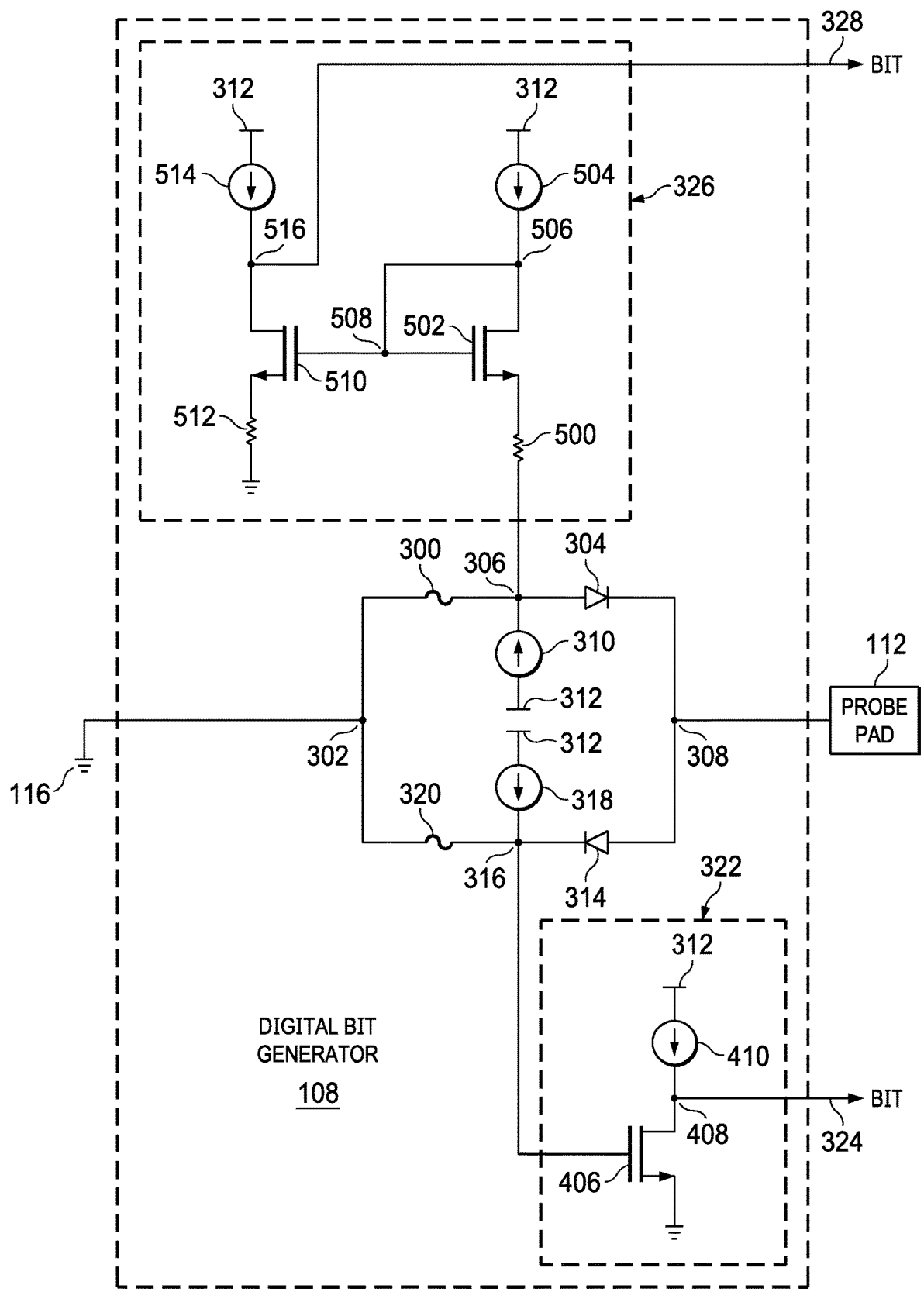
FIG. 5 is a circuit diagram of a digital bit generator in various examples.

FIG. 5 is a circuit diagram of a DBG 108 in various examples. The example DBG 108 in FIG. 5 is identical to that shown in FIG. 4, but the example in FIG. 5 includes a different example circuit for the comparator 326. Specifically, the example comparator 326 in FIG. 5 includes a resistor 500 (e.g., 10 Ohms), a transistor 502 (e.g., n-type FET) having a source coupled to the resistor 500, a current source 504 coupled to a drain of the transistor 502 at a node 506, and the voltage source 312 coupled to the current source 504. The gate of the transistor 502 is coupled to the node 506 at a node 508. The comparator 326 also includes a transistor 510 (e.g., n-type FET) having a source coupled to a resistor 512 (e.g., 10 kilo Ohms) and a gate coupled to the node 508. The drain of the transistor 510 is coupled to a current source 514 at a node 516. The current source 514 is coupled to the voltage source 312. The resistor 512 is coupled to ground. The output terminal 328 is coupled to the node 516.

In operation, the gate-to-source voltage across the transistor 502 remains sufficiently high to keep transistor 502 on. This is because the gate of the transistor 502 at node 508 is tied to the current source 504 and the voltage source 312. The voltage from node 508 to node 306 is approximately equivalent to the threshold voltage of the transistor 502 (the voltage drop across the resistor 500 being negligible because the resistance of the resistor 500 is negligible). The state of the fuse 300 causes the voltage at node 306 to be high or low. Responsive to the fuse 300 not being blown, the voltage at node 306 is low, because current provided by the current source 310 flows through the fuse 300 to the ground terminal 116. However, responsive to the fuse 300 being blown, the voltage at node 306 is pulled up by the current source 310.

Because the voltage at node 508 is greater than the voltage at node 306 by the threshold voltage of the transistor 502, the voltage at node 508 is lower responsive to the node 306 being pulled low, and the voltage at node 508 is higher responsive to the node 306 being pulled high. Responsive to the voltage at node 508 being low (e.g., responsive to the voltage at node 306 being low), the transistor 510 is either off or weakly turned on, thus enabling the current source 514 to pull up the voltage at node 516 and causing the output terminal 328 to provide a digital bit 1. Responsive to the voltage at node 508 being high (e.g., responsive to the voltage at node 306 being high), the transistor 510 is strongly on, thus causing current provided by the current source 514 to be sunk to ground and pulling the voltage at node 516 low. Responsive to the voltage at node 516 being low, the output terminal 328 provides a digital bit 0.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the term "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. The term "control terminal" may refer to a gate terminal of a transistor, and the term "non-control terminal" may refer to the source and/or drain terminals of a transistor. Modifications are possible in the described examples, and other examples are possible within the scope of the claims.

What is claimed is:

1. A circuit, comprising:
    first and second polyfuses;
    a first diode having a first diode anode and a first diode cathode, the first polyfuse coupled between the first diode anode and the second polyfuse;
    a second diode having a second diode anode and a second diode cathode, the second polyfuse coupled between the second diode cathode and the first polyfuse;
    a probe pad coupled to the first diode cathode and to the second diode anode; and
    a comparator including:
        a transistor having a control terminal and a non-control terminal, the control terminal coupled to the second diode cathode; and
        a current source coupled to the non-control terminal.
2. The circuit of claim 1, further comprising a ground terminal coupled to the first and second polyfuses.

3. The circuit of claim 1, wherein the current source is a first current source, and the circuit further comprises a second current source coupled to the first diode anode and to the first polyfuse.

4. The circuit of claim 1, wherein the current source is a first current source, and the circuit further comprises a second current source coupled to the second diode cathode and to the second polyfuse.

5. A circuit comprising:
    first and second polyfuses;
    a first diode having a first diode anode and a first diode cathode, the first polyfuse coupled between the first diode anode and the second polyfuse;
    a second diode having a second diode anode and a second diode cathode, the second polyfuse coupled between the second diode cathode and the first polyfuse;
    a probe pad coupled to the first diode cathode and to the second diode anode; and
    a comparator including:
        a transistor having a first non-control terminal, a second non-control terminal, and a control terminal, the first non-control terminal coupled to the control terminal;
        a resistor coupled between the second non-control terminal and the first diode anode; and
        a current source coupled to the first non-control terminal.

6. The circuit of claim 5, wherein the transistor is a first transistor, and the comparator includes a second transistor coupled to the control terminal.

7. The circuit of claim 6, wherein the resistor is a first resistor, and the comparator includes a second resistor coupled to the second transistor.

8. The circuit of claim 7, wherein the current source is a first current source, and the comparator includes a second current source coupled to the second transistor.

9. A circuit, comprising:
    a first fuse having a first fuse terminal;
    a first diode having a first diode anode and a first diode cathode, the first diode anode coupled to the first fuse;
    a second fuse having a second fuse terminal, the second fuse terminal coupled to the first fuse terminal;
    a second diode having a second diode anode and a second diode cathode, the second diode cathode coupled to the second fuse, the second diode anode coupled to the first diode cathode;
    a first comparator coupled to the first diode anode;
    a second comparator coupled to the second diode cathode;
    a first current source coupled to the first diode anode, the first current source configured to raise a voltage at an input to the first comparator responsive to the first fuse being open; and
    a second current source coupled to the second diode cathode, the second current source configured to raise a voltage at an input to the second comparator responsive to the second fuse being open.

10. The circuit of claim 9, wherein the first comparator includes a transistor having a transistor threshold voltage that is less than a sum of diode threshold voltages of the first and second diodes.

11. The circuit of claim 9, wherein the first and second fuses are polyfuses.

12. The circuit of claim 9, wherein the first comparator includes a transistor and a current source coupled to the transistor.

13. The circuit of claim 9, wherein the second comparator includes:
    a first resistor;

a first transistor coupled to the first resistor;
a second transistor coupled to the first transistor; and
a second resistor coupled to the second transistor.

14. A system, comprising:
an integrated circuit, including:
  a first fuse having first and second terminals;
  a second fuse having third and fourth terminals, the third terminal coupled to the first terminal;
  a first diode having a first diode anode and a first diode cathode, the first diode anode coupled to the second terminal;
  a second diode having a second diode anode and a second diode cathode, the second diode cathode coupled to the fourth terminal, the second diode anode coupled to the first diode cathode;
  a first current source coupled to the second terminal;
  a second current source coupled to the fourth terminal;
  a first comparator coupled to the second terminal;
  a second comparator coupled to the fourth terminal; and
  a probe pad coupled to the first diode cathode and the second diode anode.

15. The system of claim 14, wherein the first comparator includes a transistor having a transistor threshold voltage that is less than a sum of diode threshold voltages of the first and second diodes.

16. The system of claim 14, wherein the first current source is configured to raise a voltage at an input to the first comparator responsive to the first fuse being open.

17. The system of claim 14, wherein the second current source is configured to raise a voltage at an input to the second comparator responsive to the second fuse being open.

* * * * *